June 7, 1960 H. KORN, JR., ET AL 2,940,051

NEUTRALIZED TRANSISTOR AMPLIFIER

Filed Aug. 17, 1955

INVENTORS
Hugo Korn Jr.,
Robert P. Crow
BY
Mueller & Aichele
Attys.

United States Patent Office 2,940,051

Patented June 7, 1960

2,940,051

NEUTRALIZED TRANSISTOR AMPLIFIER

Hugo Korn, Jr., Chicago, and Robert P. Crow, Park Ridge, Ill., assignors to Motorola, Inc., Chicago, Ill., a corporation of Illinois Filed Aug. 17, 1955, Ser. No. 528,959

6 Claims. (Cl. 330—27)

The present invention relates to transistor amplifiers, and more particularly to an improved transistor amplifier of the neutralized type.

The grounded emitter transistor amplifier has been found to exhibit negative input resistance at its base electrode under certain conditions due to positive feedback so that the amplifier tends to a condition of instability and oscillation. Also, the current gain cutoff frequency of the transistor amplifier is affected by such feedback within the semiconductor. In the grounded base and in the grounded emitter transistor amplifiers, for example, the base resistance of the transistor normally produces positive feedback at the lower signal frequencies which gives rise to instability and limited bandwidth response as well as a tendency toward oscillation, as noted above. This feedback, however, has a tendency to shift in phase at the higher signal frequencies, and this reduces the effective current gain cutoff frequency of the transistor appreciably. It is, therefore, most desirable to neutralize this feedback in the transistor amplifier so as to improve, among other things, its stability and to increase its current gain cutoff frequency.

It is, accordingly, a general object of the present invention to provide an improved neutralized transistor amplifier having relatively high stability and a relatively high current gain cutoff frequency, as compared with transistor amplifiers in general.

Another object of the invention is to provide an improved and stable neutralized transistor amplifier that is economical in its construction and in which neutralization is achieved by a minimum of additional components or circuit elements and by a negligible consumption of signal power.

A feature of the invention is the provision of a neutralized transistor amplifier in which neutralization is simply and effectively obtained by connecting the circuit as a bridge, which bridge is effectively balanced insofar as feedback currents are concerned.

Another feature of the invention is the provision of such a transistor amplifier in which neutralization may be realized by the use of the bias resistors and impedance elements essential for the amplifier circuit so as to entail a minimum of additional components.

The above and other features of the invention which are believed to be new are set forth with particularity in the appended claims. The invention itself, however, together with further objects and adavantages thereof, may best be understood by reference to the following description when taken in conjunction with the accompanying drawings in which:

The invention provides a transistor amplifier which includes a transistor having a base electrode, a collector electrode and an emitter electrode, and which transistor exhibits internal resistance between a node point and each of the electrodes. An input circuit is connected between the base and emitter electrodes. A first impedance means and a load circuit are series connected between the collector electrode and the emitter electrode. And a second impedance means is connected from the common junction of the load circuit and the first impedance means to the base electrode, the first and second impedance means forming a bridge network with the respective internal resistances between the node and the base and emitter electrodes and having selected values to balance the bridge and neutralize the amplifier.

Figure 1:
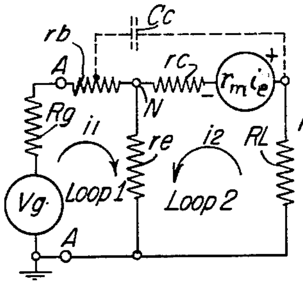
Fig. 1 is an equivalent circuit of a usual grounded-emitter transistor amplifier.

The circuit of Fig. 1 represents a grounded emitter type of transistor amplifier. The transistor itself has an internal node point N and exhibits emitter resistance ($r_e$) between this node and a point of reference potential or ground. The input signal source is represented by the generator ($V_G$) having internal resistance ($R_G$). The input signal from this source is impressed between the base electrode and ground, and the transistor exhibits base resistance ($r_b$) between this electrode and the node point N. The source of feedback current is represented by the generator ($r_m i_e$), where ($i_e$) is the emitter current and ($r_m$) is the forward transfer impedance of the transistor. This latter generator is connected in series with the load impedance ($R_L$) between the collector electrode and ground. The transistor exhibits collector resistance ($r_c$) between the node point N and the collector.

As shown in Fig. 1, the circuit resolves itself into two loops 1 and 2, with the input current ($i_1$) flowing in loop 1 and with the output current ($i_2$) flowing in loop 2. The problem is to neutralize the effect of the current ($i_2$) in loop 1 so that the input impedance is a function only of the base and emitter resistances and is unaffected by the output current.

In loop 2

$$r_m i_e = i_2(r_c + r_e + R_L) + i_1 r_e \quad (1)$$

When:

$i_e$—emitter current

And $$i_e = i_1 + i_2 \quad (2)$$

Therefore $$\frac{i_2}{i_1} = \frac{(r_m - r_e)}{r_e + r_c + R_L - r_m} \quad (3)$$

Now the input impedance—

$$Z_{in} = \frac{i_1 R_b + i_1 r_e + i_2 r_e}{i_1} \quad (4)$$

$$= r_b + r_e + \left[\frac{r_m - r_e}{r_e + r_c + R_L - r_m}\right] r_e \quad (5)$$

The bracketted term of Equation 5 is due to the effect of ($i_2$) on loop 1. To neutralize the effect of ($i_2$) in loop 1, a current is introduced into that loop which is proportional to ($i_2$) but which is of opposite phase so as to neutralize the ($i_2$) voltage drop, and make the input impedance equal ($r_b + r_e$). That is, for satisfactory neutralization, no voltage should exist across points A—A due to generator ($r_m i_e$).

Figure 2:
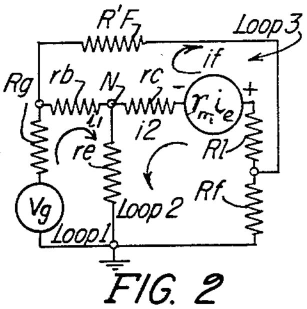
Figs. 2 and 3 are equivalent circuits of a transistor amplifier neutralized in accordance with the invention.

Fig. 2 shows a grounded emitter amplifier similar to that of Fig. 1, and with the addition of a neutralizing circuit connected in accordance with the invention to neutralize the effect of the output current ($i_2$) in loop 1. In the latter circuit, a neutralizing impedance ($R_f$) is placed in series with the load impedance ($R_L$), and the common junction of the impedances ($R_L$), and ($R_f$) is connected through a further neutralizing impedance ($R'_f$) to the base electrode. The elements ($R_L$, $r_c$, $r_b$) and ($R'_f$) form a feedback loop which is designated as loop 3 and in which the feedback current ($i_f$) flows.

Figure 3:
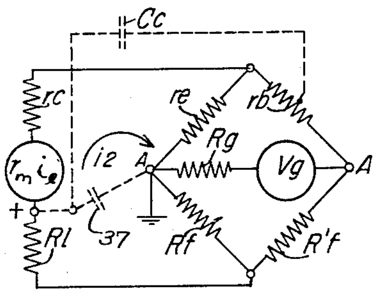

As shown in Fig. 3, the circuit configuration of Fig. 2 can be rearranged in the form of a bridge. In Fig 3 the feedback generator ($r_m i_e$) causes the current ($i_2$) to flow, but the impedances ($R_f$) and ($R'_f$) can be chosen so that no current flows through ($R_G$) and ($V_G$) so that zero potential exists across points A—A insofar as the effect of ($i_2$) is concerned. This produces the neutralized condition such as noted in conjunction with Fig. 1. In other words, the loop 3 provides a current through $r_e$ equal and opposite to the current ($i_2$) so as to neutralize the effect of ($i_2$) on the input circuit.

Figure 4:
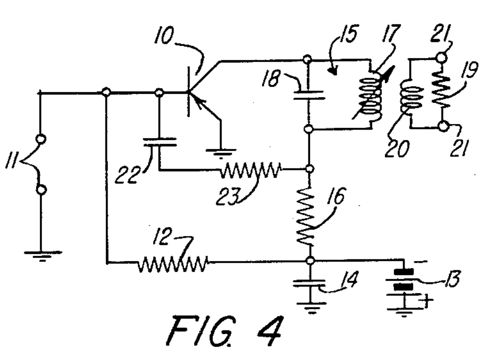
Figs. 4–7 are different circuit embodiments of the neutralized transistor amplifier of the invention.

A practical embodiment of the invention is shown in Fig. 4. This embodiment includes a transistor 10 whose emitter is connected to a point of reference potential or ground. One of the input terminals of the circuit is connected to the base electrode of transistor 10, and the other input terminal is connected to ground. The base is connected through a resistor 12 to one terminal of a unidirectional biasing potential source 13, the other terminal of this source being grounded and the source being bypassed for alternating currents by a capacitor 14. The collector electrode of transistor 10 is connected to a terminal of source 13 through a parallel-resonant network 15 and through a resistor 16 connected in series with the network. The parallel resonant network includes an inductance coil 17 shunted by a capacitor 18. The inductance coil is inductively coupled to a coil 20 which is connected to the output terminals 21 of the circuit. Resistor 19 connected across the output terminals represents the load impedance ($R_L$). The base electrode is also connected to the junction of network 15 and resistor 16 through a blocking capacitor 22 and a resistor 23.

Resistor 16 constitutes the neutralizing resistor ($R_f$) and resistor 23 constitutes the neutralizing resistor ($R'_f$). Resistor 12 is a biasing resistor. As in the previous circuits, resistors 16 and 23 form a bridge with the internal base and emitter resistances of transistor 10, and these resistors are chosen so that the bridge is balanced and the amplifier is neutralized.

A constructed embodiment of the circuit of Fig. 4 gave 28 decibels gain at 60 kilocycles with a collector current of 0.4 milliamperes. The following values were used in the circuit, and these are listed herein merely by way of example and are not intended to limit the invention in any way:

| | |
|---|---|
| Resistor **19** ________________ohms__ | 50,000 |
| Resistor **23** ________________do____ | 1,300 |
| Resistor **12** ________________do____ | 200,000 |
| Resistor **16** ________________do____ | 1,000 |
| Capacitor **18** ________micromicrofarads__ | 330 |
| Capacitor **22** ____________microfarads__ | 0.1 |
| Capacitor **14** ________micromicrofarads__ | 2,000 |
| Source **13** __________________volts__ | 4.5 |

Figure 5:
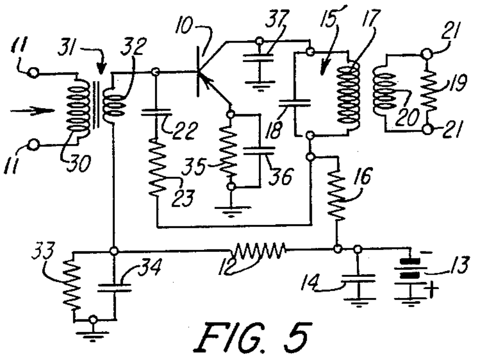

The circuit of Fig. 5 is generally similar to that of Fig. 4, and like elements have been designated by like numerals. In the circuit of Fig. 5, the input terminals 10 are connected to the primary winding 30 of a transformer 31. The secondary winding 32 of transformer 31 has one side connected to the base electrode of transistor 10. The bias resistor 12 is connected with a further resistor 33 as a potentiometer across source 13, and the common junction of resistors 12 and 33 is connected to the other side of secondary winding 32. Resistor 33 is by-passed for alternating currents by a capacitor 34. The emitter electrode of transistor 10, instead of being directly connected to ground, is connected thereto through a biasing resistor 35 shunted by a capacitor 36. The collector electrode is coupled to ground through a capacitor 37.

Source 13 provides a negative biasing potential to the collector electrode of transistor 10 through resistor 16 and tuned circuit 15. The source also supplies a lower negative biasing potential to the base electrode of the transistor through the potentiometer 12, 33 and winding 32. The bias on the emitter is controlled by the resistor 35, and in this manner a stable unidirectional biasing position is established on the transistor in a manner known to the art. Neutralization is provided similarly to that of the previously described circuit of Fig. 4 by virtue of the resistors 16 and 23.

At the higher frequencies an internal capacity $C_c$ (shown dotted in Fig. 1) produces a low impedance feedback path and prevents the bridge of Fig. 3 from being balanced. The effect of this capacity can be balanced for high frequency neutralization by capacitor 37. The balancing effect of capacitor 37 on capacity $C_c$ is shown in Fig. 3, capacitor 37 having such a value that the unbalancing effect of capacity $C_c$ on the bridge is compensated.

Figure 6:
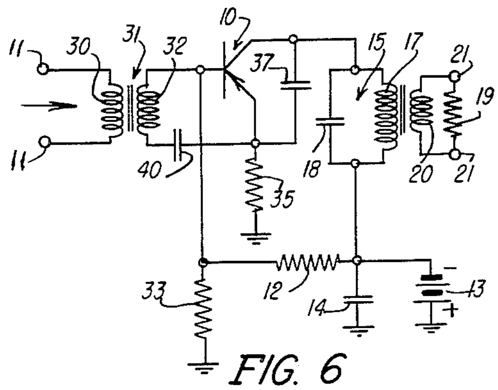

The circuit of Fig. 6 is generally similar to that of Fig. 5, and like elements have been indicated by like numerals. In the circuit of Fig. 6 a saving in components is realized by using the bias elements for neutralization. In the embodiment of Fig. 6, the emitter is connected to ground through the resistor 35 which is now unby-passed. The common junction of potentiometer resistors 12 and 33 is connected directly to the base electrode, and resistor 33 is unby-passed. The lower side of winding 32 is connected to the emitter through a blocking capacitor 40, and the capacitor 37 is returned to the emitter rather than to ground.

In the circuit of Fig. 6, resistor 35 now functions as the feedback resistor ($R_F$), and resistor 33 functions as the feedback resistor ($R'_F$). By tracing the circuit, it can be seen that the bridge arrangement of Fig. 3 is provided by these two resistors in conjunction with the internal emitter resistance and base resistance of the transistor. It can also be seen that this circuit differs, insofar as feedback neutralization is concerned, from that of Fig. 5 only in that the A.C. ground connection has been shifted from the emitter to the junction of resistors 35 and 33. That is, from the junction of ($r_e$) and ($R_F$) to the junction of ($R_F$) and ($R'_F$). Therefore, insofar as neutralization is concerned, the circuit operates in the described manner of the circuit of Fig. 5. However, neutralization in the circuit of Fig. 6 is achieved without the need for additional components. Resistor 33 continues to function in conjunction with resistor 12 to form a potentiometer for supplying the bias potential to the base electrode of the transistor, whereas resistor 35 still functions as a bias resistor for the emitter.

Figure 7:
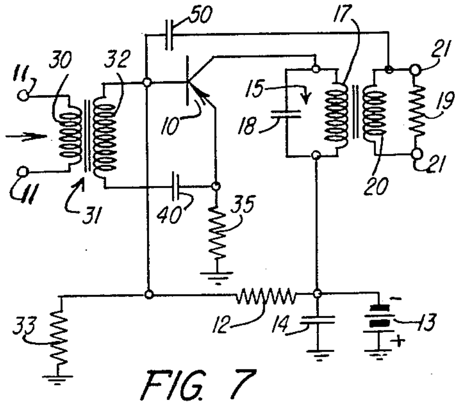

Fig. 7 is similar to the embodiment of Fig. 6. Again, like components have been indicated by like numerals. In the circuit of Fig. 7 the capacitor 37 is dispensed with, and a capacitor 50 is coupled between the base and the inductance coil 20 in the output circuit.

Capacitor 50 feeds output energy back to the base electrode in the proper phase to neutralize the effect of ($i_2$) across the internal emitter resistance ($r_e$). That is, the network of capacitor 50 constitutes an external circuit which duplicates the feedback path of the internal emitter resistance ($r_e$). The network of capacitor 50 achieves the same result as the bridge arrangement of the embodiments of Figs. 4, 5 and 6 and the result is a composite circuit which provides effective neutralization over a wide range of frequencies.

The invention provides, therefore, an improved transistor amplifier that can be effectively neutralized by a minimum of additional circuit components, and which components utilize a minimum or negligible amount of the signal power. This neutralization causes the amplifier to exhibit a high degree of stability at the lower temperature and also tends to increase the current gain cutoff frequency favorably. Moreover, this neutralization is effective in reducing the effective output capacitance of the grounded emitter amplifier thereby enabling transistors with high current gain amplification factor to be used without adversely affecting or mistuning the tuned output circuit.

We claim:

1. A transistor amplifier including in combination, a transistor having a base electrode, a collector electrode and an emitter electrode, said transistor exhibiting respective internal resistances between a node point and each of said electrodes; means connecting said emitter electrode to a point of reference potential; an input circuit connected to said base electrode; a load circuit connected to said collector electrode; first resistance means connecting said load circuit to a unidirectional biasing potential source; a circuit including second resistance means coupling the common junction of said load circuit and said first resistance means to said base electrode; a potentiometer connected across the biasing potential source; and means coupling a point on said potentiometer to said input circuit for biasing said base electrode; said first and second resistance means forming a bridge network with the respective internal resistances between said node and said base and emitter electrodes and having selected values to balance said bridge and neutralize the amplifier.

2. The transistor amplifier defined in claim 1 which includes capacitor means connected between said collector electrode and said point of reference potential.

3. A transistor amplifier including in combination, a transistor having a base electrode, a collector electrode and an emitter electrode, said transistor exhibiting respective internal resistances between a node point and each of said electrodes; impedance means connecting said emitter electrode to a point of reference potential; an input circuit connected between said base electrode and said emitter electrode; a load circuit connected to said collector electrode and to a source of unidirectional biasing potential; a potentiometer including first and second resistance means connected across the biasing potential source; and means connecting the common junction of said first and second resistance means to said base electrode, said impedance means and said first and second resistance means forming a bridge network with the respective internal resistances between said node and said base and emitter electrodes and having selected values for signal frequencies such that the ratio of the internal resistance from said emitter electrode to the node point to the internal resistance from said base electrode to the node point substantially equals the ratio of said impedance means to the impedance of the common junction of said first and second resistance means to the reference point.

4. A transistor amplifier including in combination, a transistor having a base electrode, a collector electrode and an emitter electrode, said transistor exhibiting respective internal resistances between a node point and each of said electrodes; a first un-bypassed biasing resistor connecting said emitter electrode to a point of reference potential; an input circuit connected between said base electrode and said emitter electrode; a load circuit connected to said collector electrode and to a source of unidirectional biasing potential; a potentiometer including a second resistor means connected across the biasing potential source; and means connecting said second resistor means to said base electrode for biasing the same, said first resistor and said second resistor means forming a bridge network with the respective internal resistances between said node and said base and emitter electrodes and having selected values for signal frequencies such that the ratio of the internal resistance from said emitter electrode to the node point to the internal resistance from said base electrode to the node point substantially equals the ratio of said first biasing resistor to the impedance provided by said potentiometer from said base electrode to the source of biasing potential.

5. The transistor amplifier defined in claim 4 which includes a capacitor connected between said collector and emitter electrodes for neutralizing internal capacity in said transistor between said base electrode and said collector electrode.

6. The transistor amplifier defined in claim 4 in which said load circuit includes a parallel-resonant network with an inductance coil coupled thereto, and which amplifier includes a neutralizing capacitor connected between said inductance coil and said base electrode for neutralizing said transistor throughout a given range of signal frequencies.

References Cited in the file of this patent

UNITED STATES PATENTS

| | | |
|---|---|---|
| 2,663,766 | Meacham | Dec. 22, 1953 |
| 2,694,113 | Meacham | Nov. 9, 1954 |
| 2,776,372 | Ensink et al. | Jan. 1, 1957 |
| 2,790,033 | Keiper | Apr. 23, 1957 |
| 2,794,076 | Shea | May 28, 1957 |